(12) United States Patent
Shim et al.

(10) Patent No.: US 8,346,068 B2
(45) Date of Patent: Jan. 1, 2013

(54) SUBSTRATE ROTATING AND OSCILLATING APPARATUS FOR RAPID THERMAL PROCESS

(75) Inventors: Jang Woo Shim, Gyeonggi-do (KR); Sang Seok Lee, Gyeonggi-do (KR); Woon Ki Cho, Gyeonggi-do (KR); Jun Her, Gyeonggi-do (KR)

(73) Assignee: Asia Pacific Systems Inc., Gyeonggi-do (KR)

( * ) Notice: Subject to any disclaimer, the term of this patent is extended or adjusted under 35 U.S.C. 154(b) by 343 days.

(21) Appl. No.: 12/743,842

(22) PCT Filed: Nov. 19, 2008

(86) PCT No.: PCT/KR2008/006799
§ 371 (c)(1),
(2), (4) Date: Sep. 1, 2010

(87) PCT Pub. No.: WO2009/066923
PCT Pub. Date: May 28, 2009

(65) Prior Publication Data
US 2010/0322603 A1   Dec. 23, 2010

(30) Foreign Application Priority Data

Nov. 22, 2007   (KR) .................. 10-2007-0119833

(51) Int. Cl.
*F26B 3/30* (2006.01)
*F27B 5/14* (2006.01)

(52) U.S. Cl. ........ 392/418; 392/416; 219/390; 219/405; 219/411; 118/724; 118/725; 118/50.1

(58) Field of Classification Search .................. 392/416, 392/418; 219/390, 405, 411; 118/724, 725, 118/50.1
See application file for complete search history.

(56) References Cited

U.S. PATENT DOCUMENTS 6,151,447 A   11/2000   Moore et al.

FOREIGN PATENT DOCUMENTS

| JP | 2002-100602 | 4/2002 |
|---|---|---|
| KR | 10-2002-0018241 | 3/2002 |
| KR | 10-0523674 | 10/2005 |
| KR | 10-2004-0033676 | 11/2005 |

*Primary Examiner* — Shawntina Fuqua
(74) *Attorney, Agent, or Firm* — Occhiuti Rohlicek & Tsao LLP

(57) ABSTRACT

Disclosed is a substrate rotating and oscillating apparatus for a rapid thermal process (RTP), that oscillates an oscillation plate using an oscillation motor moved by an elevating unit. Rotational shafts of the oscillation motor comprise lower and upper center rotational shafts mounted on a central axis of the motor, and an eccentric shaft mounted between the lower and the upper center rotational shafts as deviated from the central axis. An oscillation cam is mounted to the eccentric cam. The oscillation plate has an oscillation hole for inserting the oscillation cam therein. A bearing is mounted between the oscillation cam and the eccentric shaft such that the oscillation cam rotates independently from the eccentric shaft. The oscillation plate supports the whole multipole-magnetized magnetic motor or maglev motor. Accordingly, the substrate can be uniformly heated by both rotating and all-directionally oscillating the substrate.

17 Claims, 16 Drawing Sheets

(a)

(b)

(a)

(b)

(c)

SUBSTRATE ROTATING AND OSCILLATING APPARATUS FOR RAPID THERMAL PROCESS

CROSS-REFERENCE TO RELATED APPLICATIONS

This application is the National Stage of International Application No. PCT/KR2008/006799, filed on Nov. 19, 2008, which claims the priority of Korean Application No. 10-2007-0119833, filed on Nov. 22, 2007, the contents of which are incorporated herein by reference in their entirety.

TECHNICAL FIELD

The present invention relates to a substrate rotating and oscillating apparatus for a rapid thermal process (RTP), and more particularly to a substrate rotating and oscillating apparatus for an RTP, capable of oscillating horizontally a substrate in all directions as well as rotating the substrate.

BACKGROUND ART

Generally, in a rapid thermal processing (RTP) device, the most significant factor is a speed for heating up a substrate to a desired temperature. Also, the substrate should be uniformly heated. However, as the size of substrates is increasing, it becomes difficult to achieve the uniform heating. To overcome such a problem, there has been introduced an apparatus that horizontally rotates the substrate during the RTP.

In order to restrain generation of noise, vibration and particles, a maglev motor or a multipole-magnetized magnet has been adopted for the substrate rotating apparatus. However, in spite of trying various substrate rotating methods, ununiform heat overlapping sections 15a are inevitably generated as shown in FIG. 1. More specifically, since lights emitted from heating lamps 10 are overlapped, the heat overlapping sections 15a are generated in the annular form as the substrate 20 is rotated horizontally. When an oxide layer is grown on the substrate 20 with such an RTP device, thickness of an oxide layer 17a is increased along the annular heat overlapping sections 15a as shown in FIG. 1c. As a result, the oxide layer 17a is grown with ununiform thicknesses throughout.

Thus, mere horizontal rotation of the substrate is insufficient to prevent ununiform heating of the substrate.

DISCLOSURE OF INVENTION

Technical Problem

Therefore, the present invention has been made in view of the above problems, and it is an object of the present invention to provide a substrate rotating and oscillating apparatus for a rapid thermal process (RTP), capable of solving the problem of nonuniform heating of a substrate, by increasing a degree of freedom regarding movement of the substrate and thereby oscillating the substrate horizontally in all directions as well as rotating the substrate horizontally.

Technical Solution

In accordance with an aspect of the present invention, the above and other objects can be accomplished by the provision of a substrate rotating and oscillating apparatus for a rapid thermal process (RTP), comprising a substrate rotating unit connected to a substrate supporter which supports a substrate so as to rotate the substrate by rotating the substrate supporter, an oscillation plate that supports the substrate rotating unit, and a substrate oscillating unit that oscillates the substrate by horizontally oscillating the oscillation plate.

Here, the substrate rotating unit comprises an oscillation motor of which rotational shafts comprise a lower center rotational shaft, an eccentric shaft, and an upper center rotational shaft, the lower and the upper center rotational shafts mounted on a central axis of the motor and the eccentric shaft mounted between the lower and the upper center rotational shafts to be deviated from the central axis, an elevating unit moving the oscillation motor up and down, an oscillation cam mounted to the eccentric cam, and the oscillation plate having an oscillation hole for inserting the oscillation cam therein.

The substrate rotating unit may comprise a rotation motor, a lower multipole-magnetized magnetic wheel connected to a rotational shaft of the rotation motor and mounted with a magnet on an upper surface thereof, an upper multipole-magnetized magnetic wheel disposed above the lower multipole-magnetized magnetic wheel and rotated along with the lower multipole-magnetized magnetic wheel by a magnetic force of the lower multipole-magnetized magnetic wheel, a multipole-magnetized magnetic drum having a disc formed, being connected to a rotational shaft of the upper multipole-magnetized magnetic wheel and mounted with magnets on a sidewall thereof, and a multipole-magnetized magnetic ring connected to the substrate supporter, mounted adjacent to the multipole-magnetized magnetic drum by an outer surface thereof, and equipped with magnets on the outer surface, so as to be rotated along with the multipole-magnetized magnetic drum by a magnetic force of the multipole-magnetized magnetic drum. Here, the oscillation plate may have an annular shape including an upward bent portion formed by bending an inner rim thereof upward, and a bearing is mounted between an inner surface of the multipole-magnetized magnetic ring and the upward bent portion. The rotation motor may be disposed at the outside of an RTP chamber, and a bellows may be mounted to seal a gap between the rotation motor and the RTP chamber.

The substrate rotating unit may comprise a stator having an annular form wound by a coil, and a rotor mounted inside the stator and rotated by a magnetic field force generated from the coil, being in connection with the substrate supporter. In this case, the stator and the rotor are both disposed within the RTP chamber.

The oscillation plate may be equipped with X-axis, Y-axis, and Z-axis displacement sensors.

The elevating unit and the oscillation motor may be mounted at the outside of the RTP chamber, whereas the oscillation cam is mounted in the RTP chamber. Here, a gap between the oscillation motor and the RTP chamber may be sealed by a bellows.

A bearing may be mounted between the oscillation cam and the eccentric shaft such that the oscillation cam is able to rotate independently from the eccentric shaft.

The oscillation cam may have a truncated cone shape narrowing upward while the oscillation hole also has the truncated cone shape so as to correspondingly insert the oscillation cam.

The upper center rotational shaft may be mounted with a centering cam, and the oscillation plate may be formed with a centering hole extended upward from the oscillation hole to insert the centering cam therein. The centering cam has an inverse truncated cone shape which is narrowing downward, and the centering hole also has the inverse truncated cone shape to correspondingly insert the centering cam therein. A bearing may be mounted between the centering cam and the upper center rotational shaft such that the centering cap can be rotated independently from the upper center rotational shaft.

The oscillation cam and the centering cam may be configured such that the centering cam is separated upward from the centering hole when the oscillation cam is moved up and inserted in the oscillation hole, and such that the oscillation cam is separated downward from the oscillation hole when the centering cam is moved down and inserted in the centering hole.

The oscillation plate may be horizontally oscillated as placed on and guided by a horizontal free linear motion (LM) block. In this case, the horizontal free LM block may comprise a lower LM guide constituted by a lower LM block placed on an upper surface of a lower LM rail, an upper LM guide, being constituted by an upper LM block placed on a lower surface of an upper LM rail, guiding a linear motion of the oscillation plate in a perpendicular direction to the motion of the lower LM guide, and a connector connecting the lower LM block of the lower LM guide with the upper LM block of the upper LM guide such that the lower LM block and the upper LM block are moved together.

Advantageous Effects

As can be appreciated from the above explanation, according to the embodiment of the present invention, a substrate can be heated uniformly since being horizontally rotated and also oscillated in all directions during a rapid thermal process (RTP).

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Hereinafter, exemplary embodiments of the present invention will be described in detail with reference to the accompanying drawings. It is noted that the embodiments described hereinbelow are suggested only by way of example for better understanding of the invention. Therefore, those skilled in the art will appreciate that the present invention is not limited to the embodiments but various modifications, additions and substitutions are possible without departing from the scope and spirit of the invention.

Figure 1:
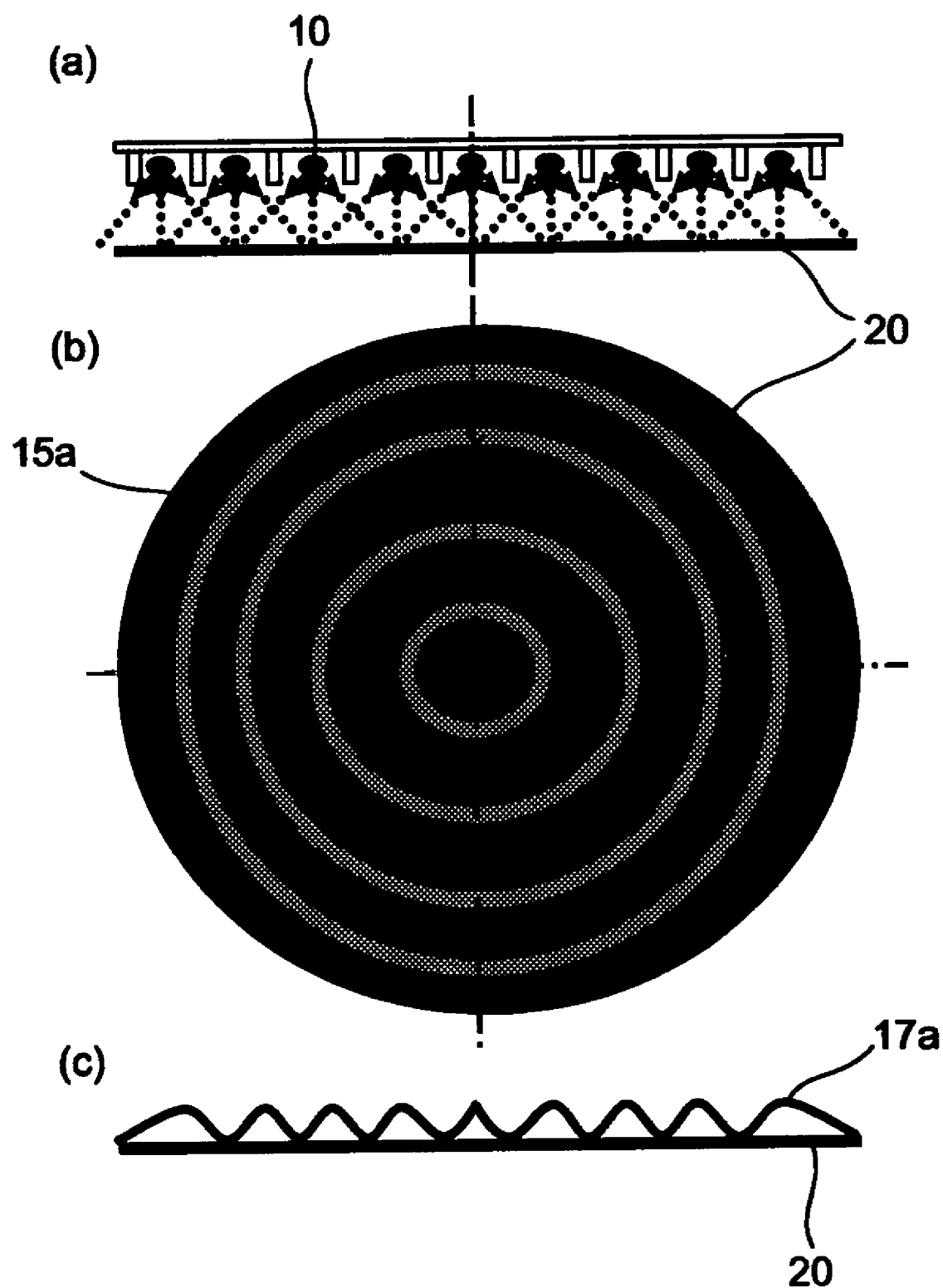
FIG. 1 is a view illustrating a substrate rotation type rapid thermal processing (RTP) device according to a conventional art.
Figure 2:
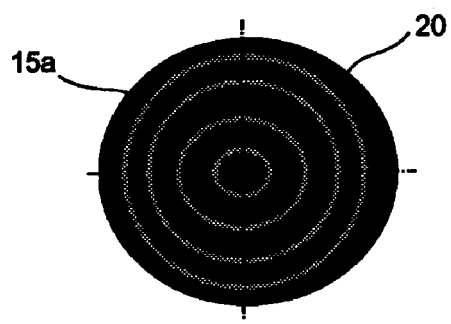
FIG. 2 is a concept view explaining the principle in that the substrate is uniformly heated by being oscillated horizontally in all directions as well as being rotated horizontally.
Figure 2:
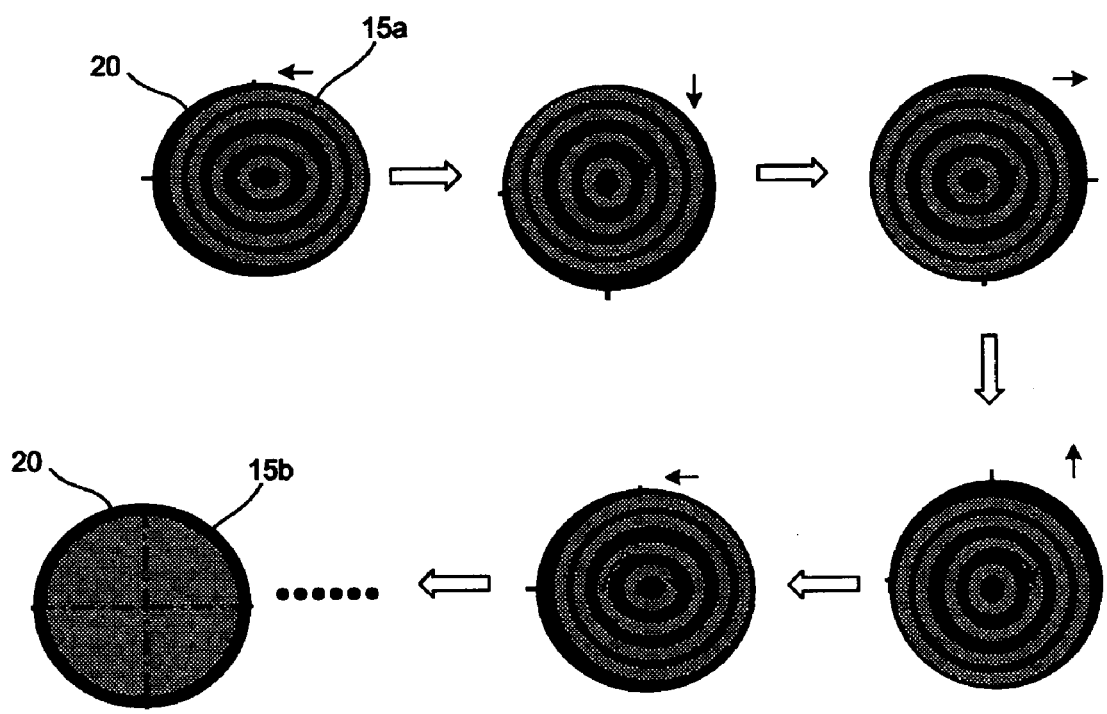

FIG. 2 is a concept view for explaining the principle in that the substrate is uniformly heated when being oscillated horizontally in all directions as well as being rotated horizontally. When the substrate 20 is merely rotated in a horizontal position as shown in FIG. 2a, heat overlapping sections 15a of an annular form are generated. On the other hand, when the substrate 20 is oscillated horizontally in all directions while also being rotated horizontally, overlapping of heat is uniformed, thereby obtaining relatively uniform heat overlapping sections 15b.

Figure 3:
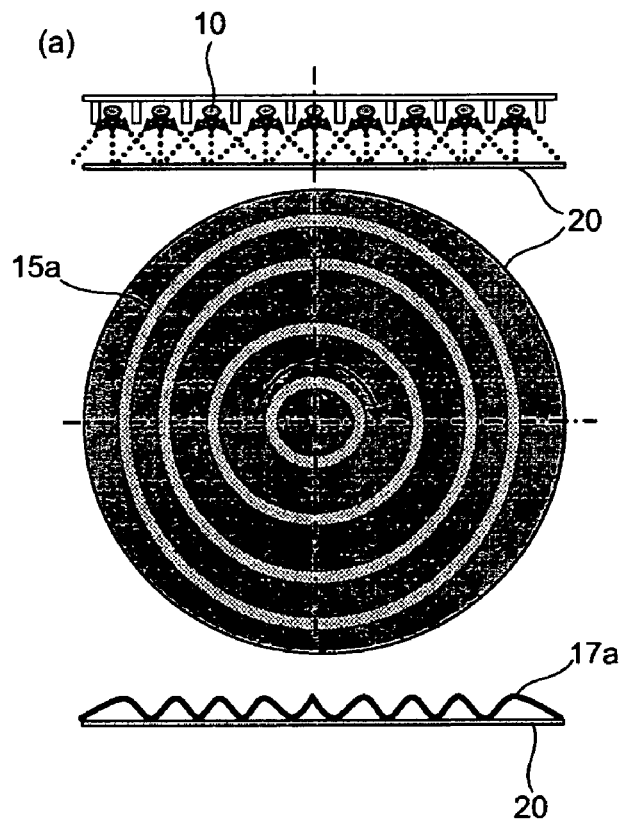
FIG. 3 comparatively shows heat overlapping sections in a case where only horizontal rotation is performed with respect to the substrate, and heat overlapping sections in a case where both the horizontal rotation and all-directional horizontal oscillation are performed to the substrate.
Figure 3:
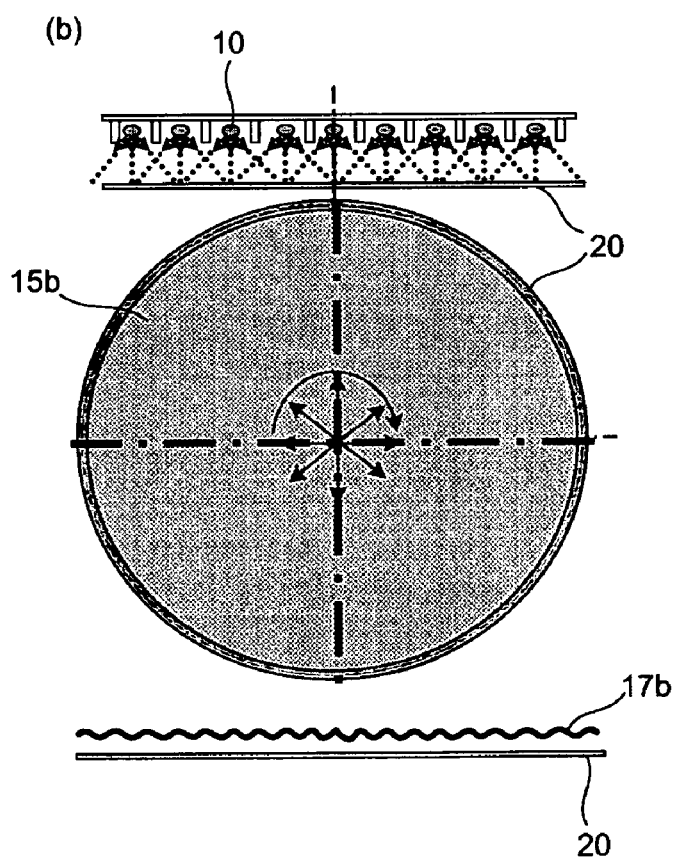

FIG. 3 comparatively shows heat overlapping sections in a case where the substrate is only rotated horizontally, and heat overlapping sections in a case where the substrate is both rotated and all-directionally oscillated. When the substrate is only horizontally rotated, the annular heat overlapping sections 15a are generated and accordingly an ununiform-thickness oxide layer 17a is obtained. When the substrate is rotated and also freely oscillated in a horizontal position, on the other hand, the uniform heat overlapping sections 15b are generated and accordingly a uniform-thickness oxide layer 17b can be obtained.

EMBODIMENT 1

Figure 4:
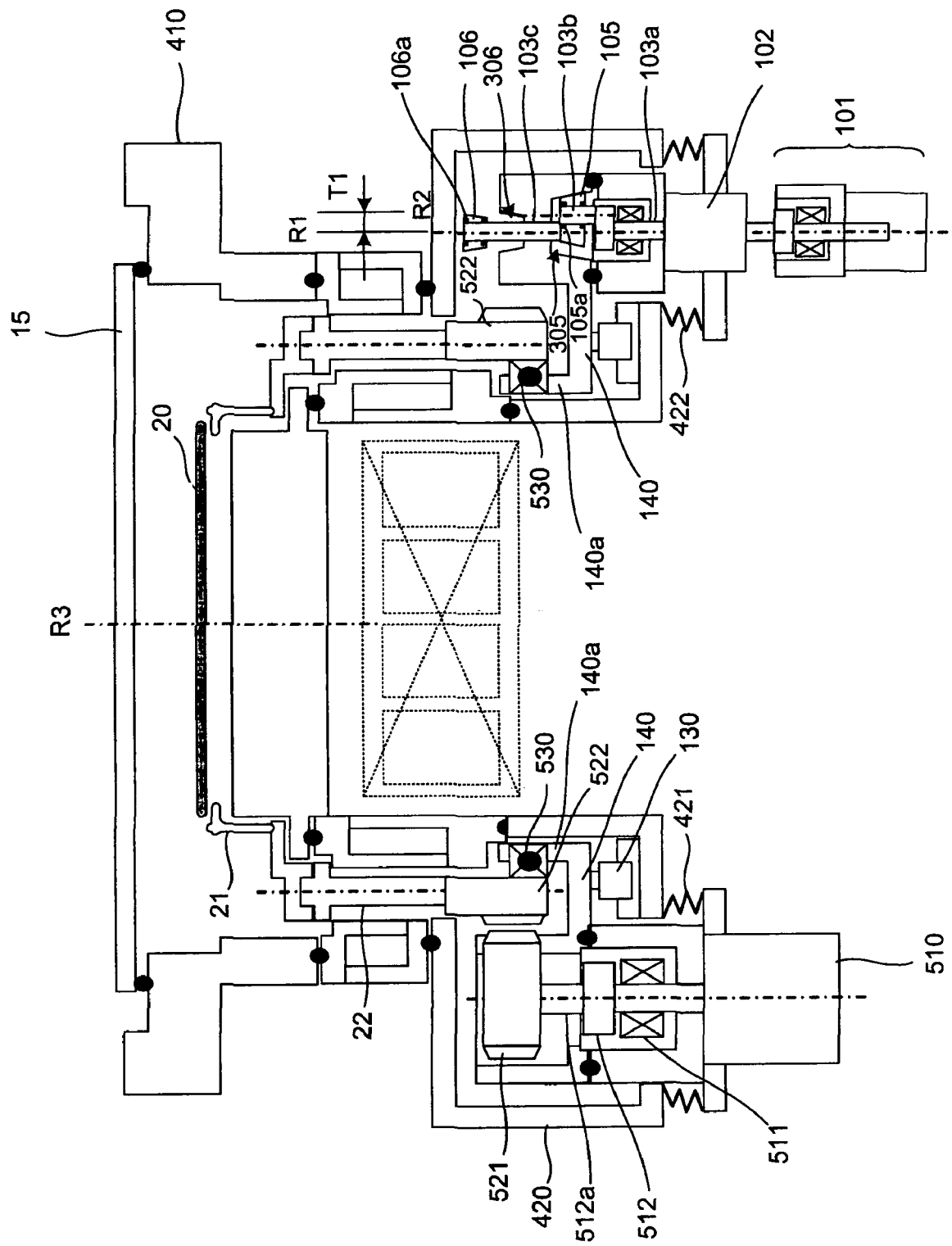
FIG. 4 is a view illustrating a substrate oscillating apparatus for an RTP, according to a first embodiment of the present invention.

Horizontal Rotation with Horizontal Oscillation in Multipole-Magnetized Magnet System FIG. 4 shows a substrate rotating and oscillating apparatus for the RTP according to a first embodiment of the present invention. The present invention is characterized in that a substrate is both horizontally rotated and horizontally oscillated, by horizontally oscillating a multipole magnet type substrate rotating apparatus granted with a patent as KR Patent No. 523674 (Oct. 18, 2005) filed by the present applicant.

[Substrate Rotating Apparatus]

The multipole-magnetized magnet type substrate rotating apparatus illustrated in FIG. 4 is already filed by the present applicant and patent-registered as KR Patent No. 523674 (Oct. 18, 2005). Therefore, the substrate rotating apparatus will be briefly explained herein.

Figure 5:
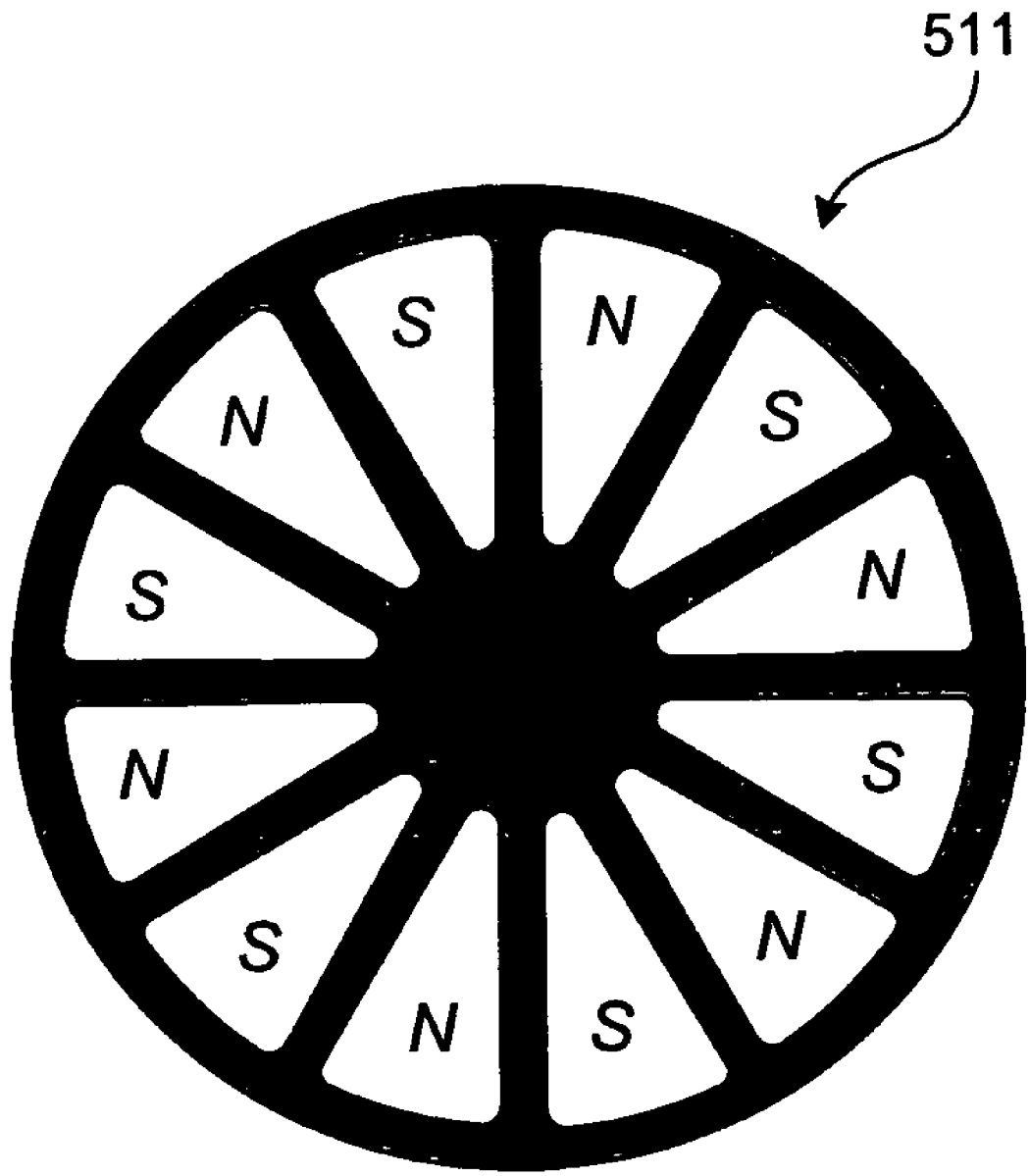
FIG. 5 is a view for explaining the structure of a lower multipole-magnetized magnet wheel 511 shown in FIG. 4.

When a rotation motor 510 is rotated, a lower multipole-magneted magnet wheel 511 in connection with a rotational shaft of the rotation motor 510 is rotated horizontally. As seen from the above, the lower multipole-magnetized magnet wheel 511 is structured in a manner that N-poles and S-poles are alternately arranged along a circular arc as shown in FIG. 5. An upper multipole-magnetized magnet wheel 512 is mounted at an upper part of the lower multipole-magnetized magnet wheel 511, facing the lower multipole-magnetized magnet wheel 511 in parallel. The upper multipole-magnetized magnet wheel 512 is structured in the same manner as the lower multipole-magnetized magnet wheel 511, and the magnet wheels 511 and 512 are facing each other with opposite poles so that a magnetic attractive force is exerted therebetween. Therefore, as the lower multipole-magnetized magnet wheel 511 rotates horizontally, the upper multipole-magnetized magnet wheel 512 is also rotated by the magnetic force. In addition, a magnetic permeant wall (not shown) is mounted between the lower and the upper multipole-magnetized magnet wheels 511 and 512.

Figure 6:
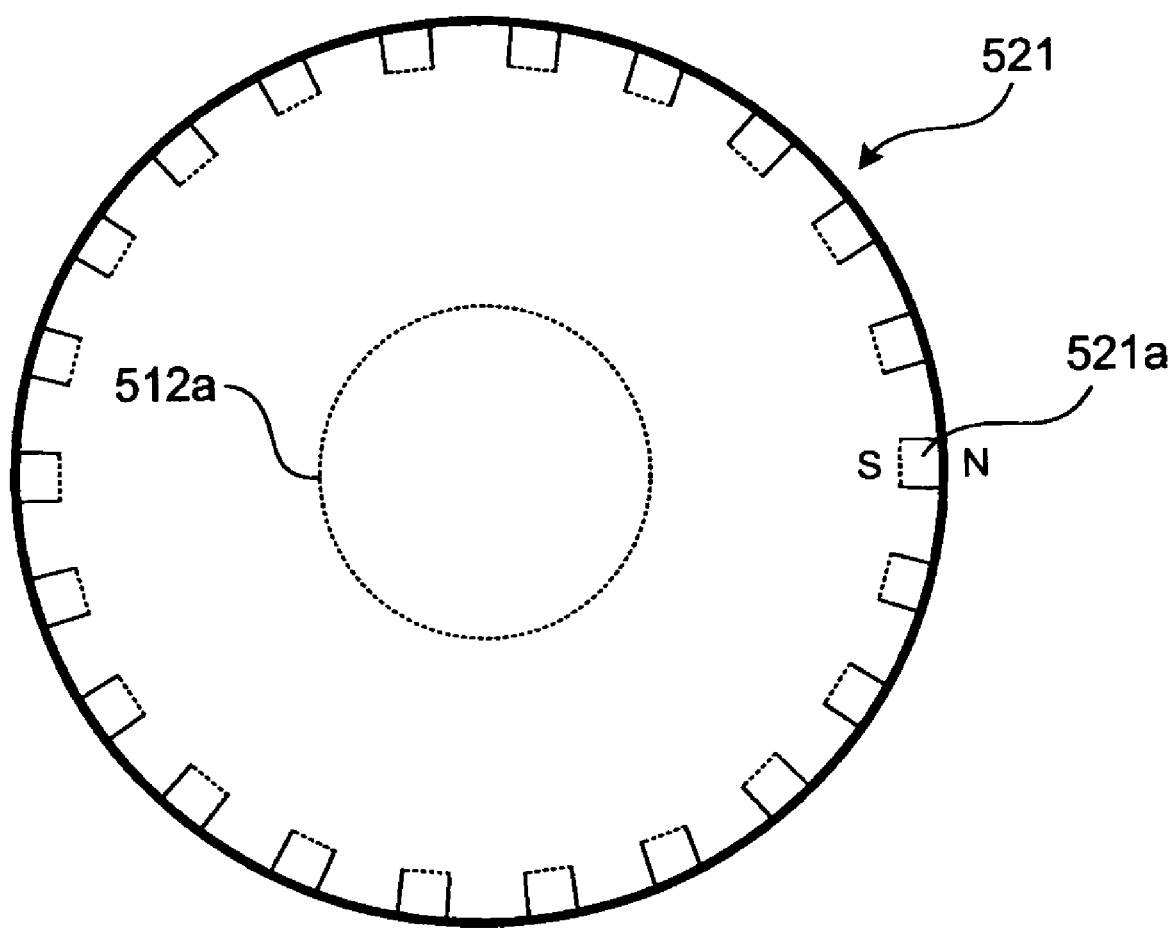
FIG. 6 is a view for explaining the structure of a multipole-magnetized magnet drum 521 shown in FIG. 4.

A multipole-magnetized magnetic drum 521 has a disc form of which the center is connected with a rotational shaft 512a of the upper multipole-magnetized magnetic wheel 512, and therefore is rotated horizontally according to rotation of the multipole-magnetized magnetic wheel 512. Magnets 521a are mounted on a sidewall of the multipole-magnetized magnetic drum 521 in a manner that N-poles thereof are directed outward as shown in FIG. 6.

Figure 7:
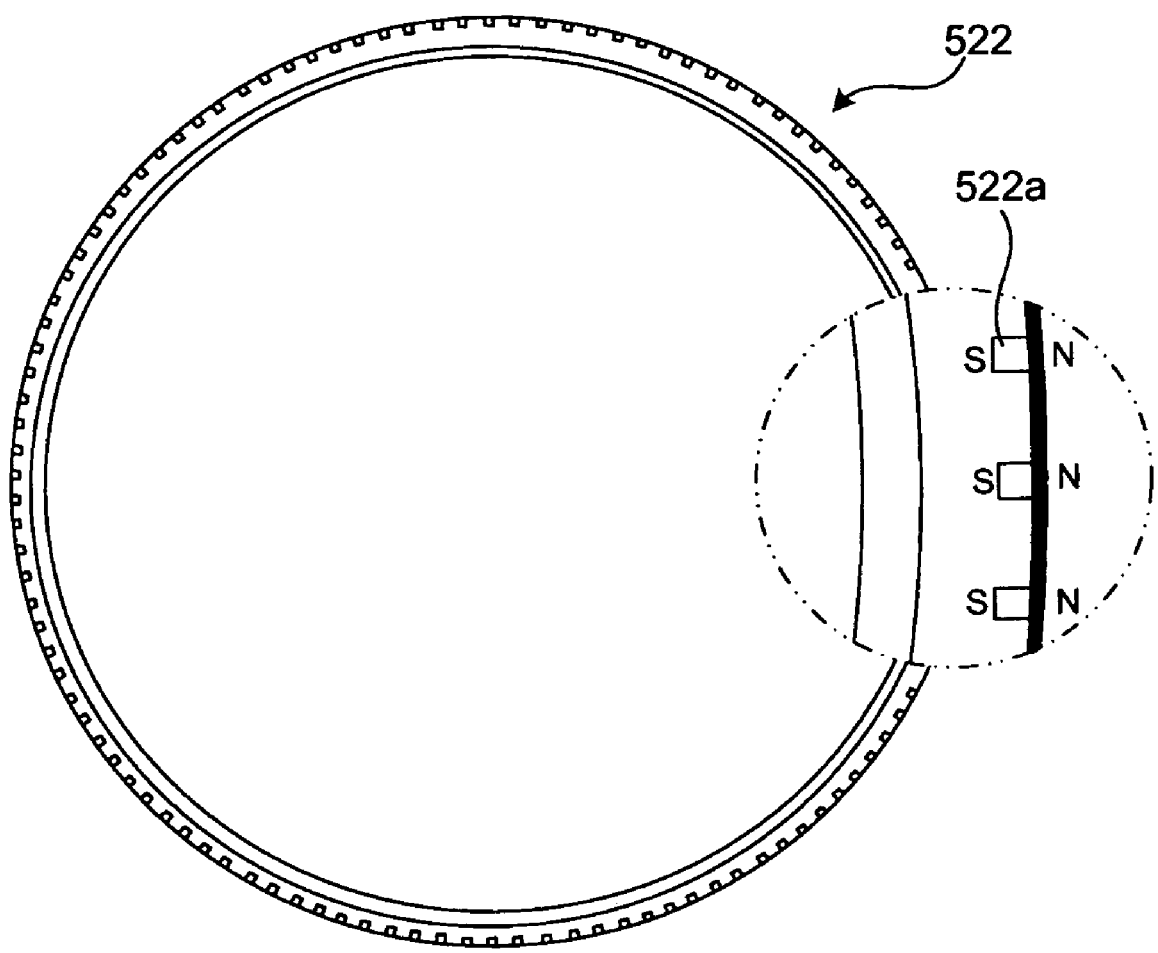
FIG. 7 is a view for explaining the structure of a multipole-magnetized magnet ring 522 shown in FIG. 4.
Figure 8:
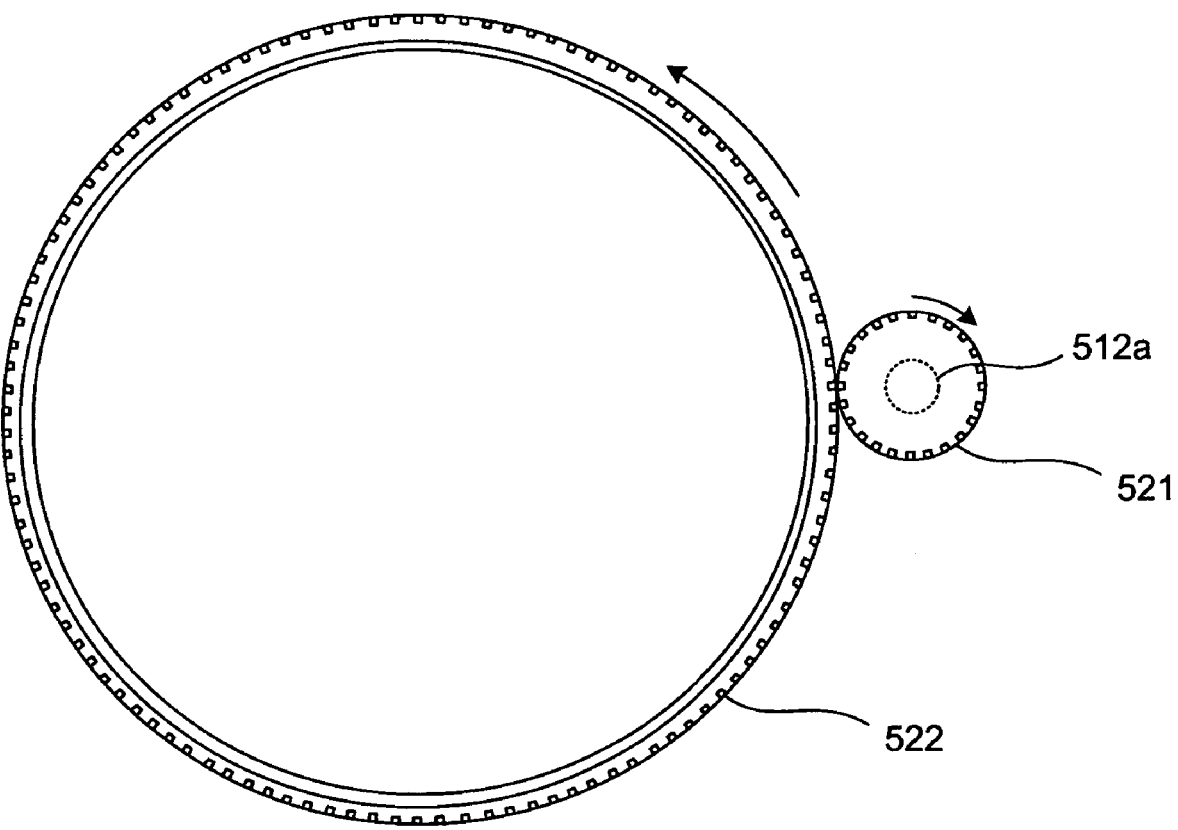
FIG. 8 is a view illustrating power transmitting process of the multipole-magnetized magnet drum 521 and the multipole-magnetized magnet ring 522.

A multipole-magnetized magnetic ring 522 is mounted in a manner that an outer surface thereof is adjacent to the sidewall of the multipole-magnetized magnetic drum 521. In addition, as shown in FIG. 7, magnets 522a are further mounted on a sidewall of the multipole-magnetized magnetic ring 522 in a manner that N-poles thereof are directed outward. Accordingly, as the multipole-magnetized magnetic drum 521 rotates, the multipole-magnetized magnetic ring 522 is accordingly rotated as if gearconnected with the multipole-magnetized magnetic drum 521, as shown in FIG. 8.

The multipole-magnetized magnetic drum 522 is connected to a substrate supporter 21 through a connection member 22. In the above-structured substrate rotating unit, power transmission is performed passing through the rotation motor 510, the lower multipole-magnetized magnetic wheel 511, the upper multipole-magnetized magnetic wheel 512, the multipole-magnetized magnetic drum 521, the multipole-magnetized magnetic ring 522, the connection member 22 and then the substrate supporter 21 in that order, and therefore the substrate 20 is horizontally rotated with respect to an axis R3. A quartz window 15 is provided between heating lamps (not shown) and the substrate 20.

The whole substrate rotating unit is supported by an oscillation plate 140 having an annular form. An inner rim of the oscillation plate 140 is bent upward, thereby forming an upward bent portion 140a. A bearing 530 is mounted between the upward bent portion 140a and an inner surface of the multipole-magnetized magnetic ring 522, such that the multipole-magnetized magnetic ring 522 can be stably supported while rotating.

A lower part of a chamber 510 is sealed by a housing 420. The substrate rotating unit is installed in the housing 420. If the rotation motor 510 is disposed in the housing 420, vibration would be incurred and this digresses from the object of adopting such a non-contact magnet structure. Therefore, while the rotation motor 510 is disposed at the outside of the housing 420, a bellows 421 is mounted to seal the gap between the rotation motor 510 and the housing 420.

[Substrate Oscillating Apparatus]

Referring to FIG. 4, horizontal oscillation of the substrate 20 is performed by oscillating the whole substrate rotating apparatus. Such oscillation of the whole substrate rotating apparatus can be achieved by oscillating the annular oscillation plate 140.

A 4-direction horizontal free linear motion (LM) block 130 is mounted to a lower surface of the housing 420. The annular oscillation plate 140 is placed on the 4-direction horizontal free LM block 130.

Rotational shafts of an oscillation motor 102 comprise a lower center rotational shaft 103a, an eccentric shaft 103b, and an upper center rotational shaft 103c. The eccentric shaft 103b is disposed between the lower center rotational shaft 103a and the upper center rotational shaft 103c. While the lower and the upper center rotational shafts 103a and 103c are mounted on a central axis R1 of the oscillation motor 102, the eccentric shaft 103b is mounted on an eccentric line R2 a bit deviated from the central axis R1.

An oscillation cam 105 is mounted to the eccentric shaft 103b, and the centering cam 106 is mounted to the upper center rotational shaft 103c. A bearing 105a is mounted between the oscillation cam 105 and the eccentric shaft 103b so that the oscillation cam 105 is able to rotate independently from the eccentric shaft 103b. In addition, another bearing 106a is mounted between a centering cam 106 and the upper center rotational shaft 103c so that the centering cam 106 is able to rotate independently from the upper center rotational shaft 103c.

The oscillation cam 105 has a truncated cone shape which is narrowed toward the upper side. The oscillation hole 305 also has the truncated cone shape so as to correspondingly insert the oscillation cam 105. On the other hand, the centering cam 106 has an inverse truncated cone shape being narrowed toward the lower side. The centering hole 306 also has the inverse truncated cone shape to correspondingly insert the centering cam 106 therein.

The oscillation cam 105 and the centering cam 106 are configured such that the centering cam 106 is separated upward from the centering hole 306 as the oscillation plate 105 is moved up and inserted in the oscillation hole 305. Also, as the centering cam 106 is moved down and inserted in the centering hole 306, the oscillation cam 105 is separated downward from the oscillation hole 305.

The vertical motion of the oscillation cam 150 can be achieved as the oscillation motor 102 is totally moved up and down by an elevating unit 101. If the oscillation motor 102 is mounted in the housing 420, vibration would be generated, thereby deteriorating the effect of the non-contact magnet structure. Therefore, the elevating unit 101 and the oscillation motor 102 are also preferred to be mounted at the outside of the housing 420. Considering the vertical movement of the oscillation motor 102 and sealing of the chamber 410, a bellows 422 is connected between the oscillation motor 102 and the housing 420.

FIG. 9 through FIG. 12 are views illustrating the operational processes of the substrate oscillating apparatus shown in FIG. 4.

Figure 9:
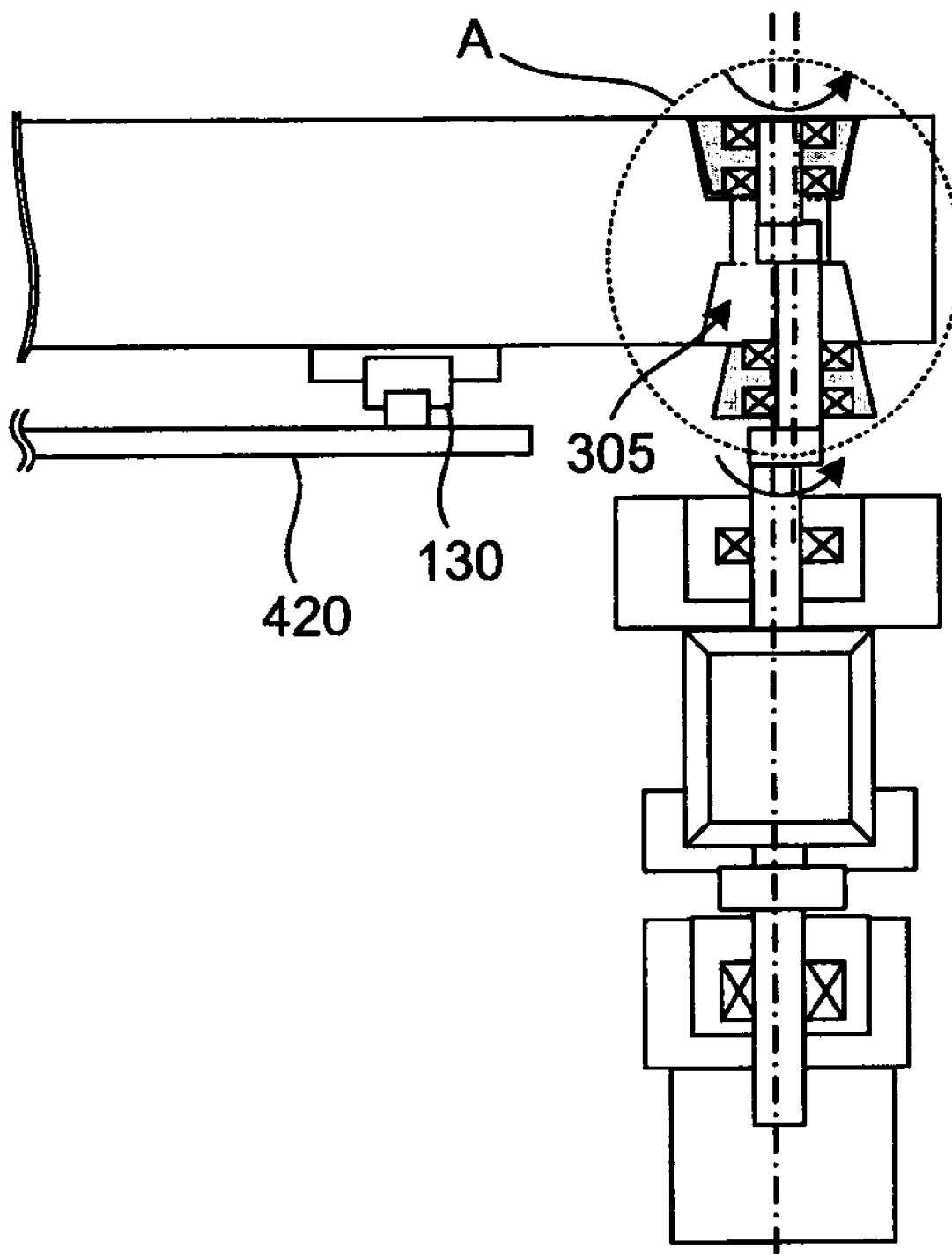
FIG. 9 to FIG. 12 illustrate the operational process of the substrate oscillating apparatus shown in FIG. 4.

First, the centering cam 106 is in the centering hole 306 as shown in a part A of FIG. 9, and therefore the oscillation cam 105 is separated downward from the oscillation hole 305. During this, the rotation motor 510 and the oscillation motor 102 are in operation.

Being out of the oscillation hole 305, the oscillation cam 105 cannot influence the operation of the oscillation plate 140. Since the centering cam 106 is independently rotated from the upper center rotational shaft 103c due to the bearing 106a mounted between the upper center rotational shaft 103c and the centering cam 106, the centering cam 106 as inserted in the centering hole 306 cannot influence the operation of the oscillation plate 140 in spite of rotation of the oscillation motor 102. Accordingly, in the state of FIG. 9, the substrate is only rotated horizontally by the rotation motor 510.

Next, the oscillation motor 102 is moved upward and downward by the elevating unit 101. Therefore, the oscillation cam 105 is inserted in the oscillation hole 305 whereas the centering cam 106 is separated upward from the centering hole 306, as shown in a part B of FIG. 10.

Since both the oscillation cam 105 and the oscillation hole 305 have such a truncated cone shape narrowing upward, the upward movement of the oscillation cam 105 is finally restricted by an upper part of the oscillation hole 305. When the elevating unit 101 is excessively moved upward, an excessive pushing force may be exerted between the oscillation cam 105 and the oscillation plate 140. Considering this, a buffer member (not shown), being formed of an elastic material, may be further mounted to the elevating unit 101 to be disposed between the elevating unit 101 and the oscillation motor 102.

Figure 10:
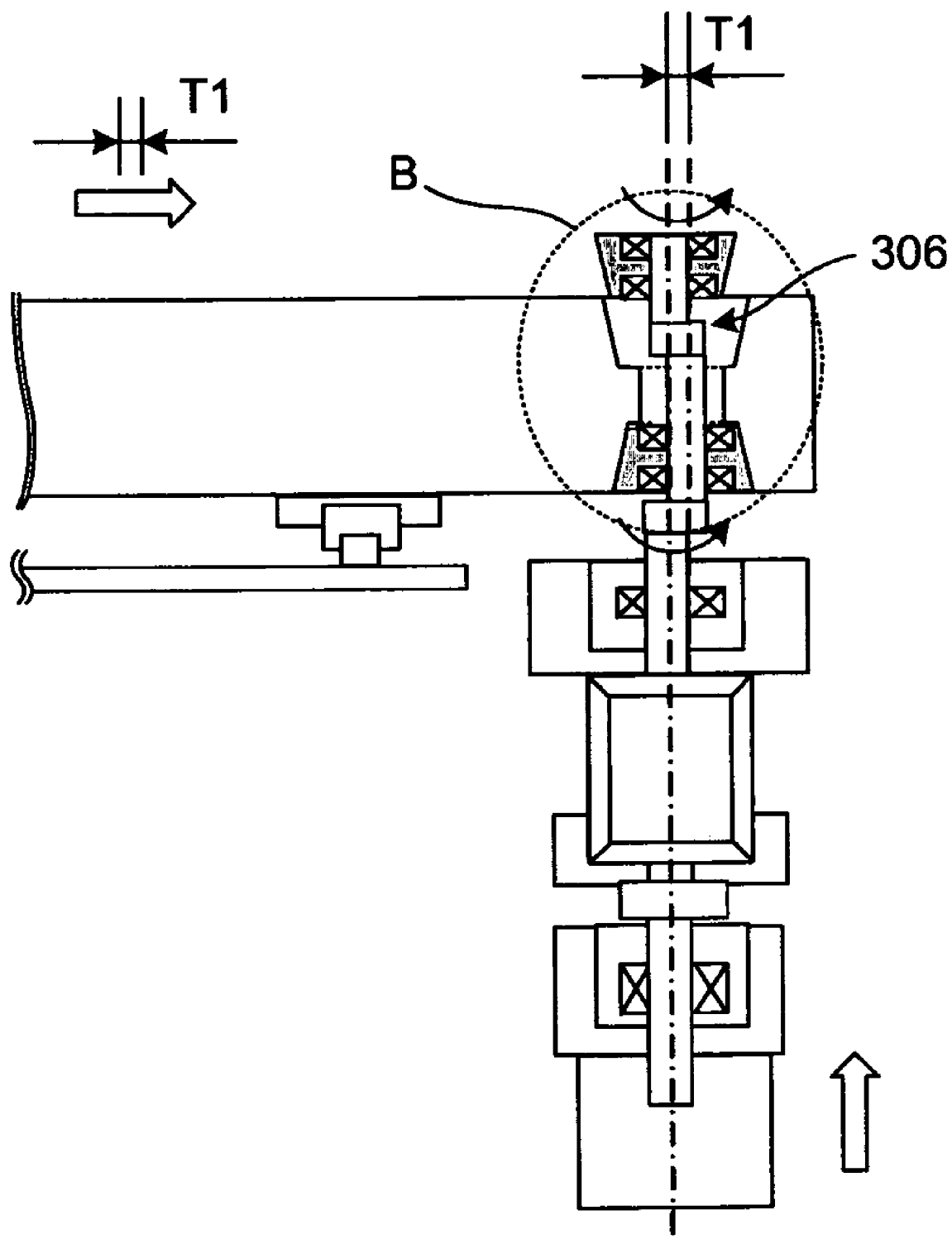

In the state of FIG. 9, the centering cam 106 is inserted in the centering hole 306, and therefore the oscillation plate 140 is aligned to the central axis R1 of the motor. As the centering cam 106 escapes the centering hole 306 as shown in FIG. 10, however, the oscillation cam 105 is inserted in the oscillation hole 305 and therefore the oscillation plate 140 is aligned to the eccentric line R2. Accordingly, the oscillation plate 140 is horizontally oscillated by an oscillating radius T1. Here, the oscillating radius T1 may correspond to an interval between the central axis R1 and the eccentric line R2.

Owing to the bearing 105a mounted between the eccentric line 103b and the oscillation cam 106, the oscillation cam 106 is idly rotated with respect to the eccentric shaft 103b. Therefore, the oscillation plate 140 is not horizontally rotated by rotation of the oscillation motor 102 but just moved horizontally as much as the oscillation radius T1.

Figure 11:
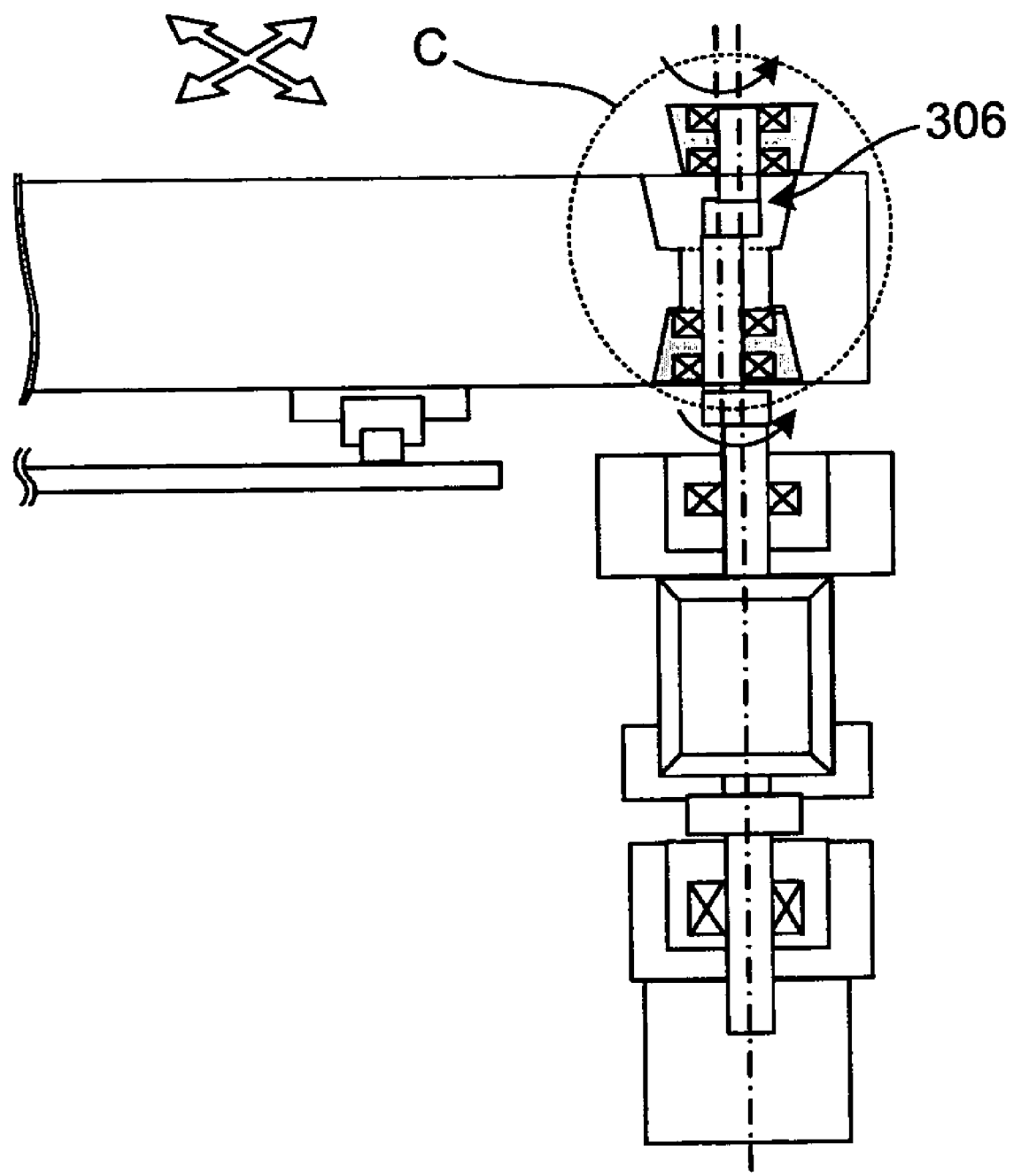

When the oscillation motor 102 keeps rotating in this state, the eccentric shaft 103b disposed on the right side as shown in the part B of FIG. 10 is moved to the left side as shown in a part C in FIG. 11. According to this, the oscillation plate 140 is moved to the left.

Although it seems that the oscillation plate 140 moves only in the lateral directions referring to FIG. 10 and FIG. 11, the oscillation plate 140 actually oscillates horizontally in all directions considering continuous relative movements between the oscillation plate 140 and the eccentric shaft 103b.

Figure 12:
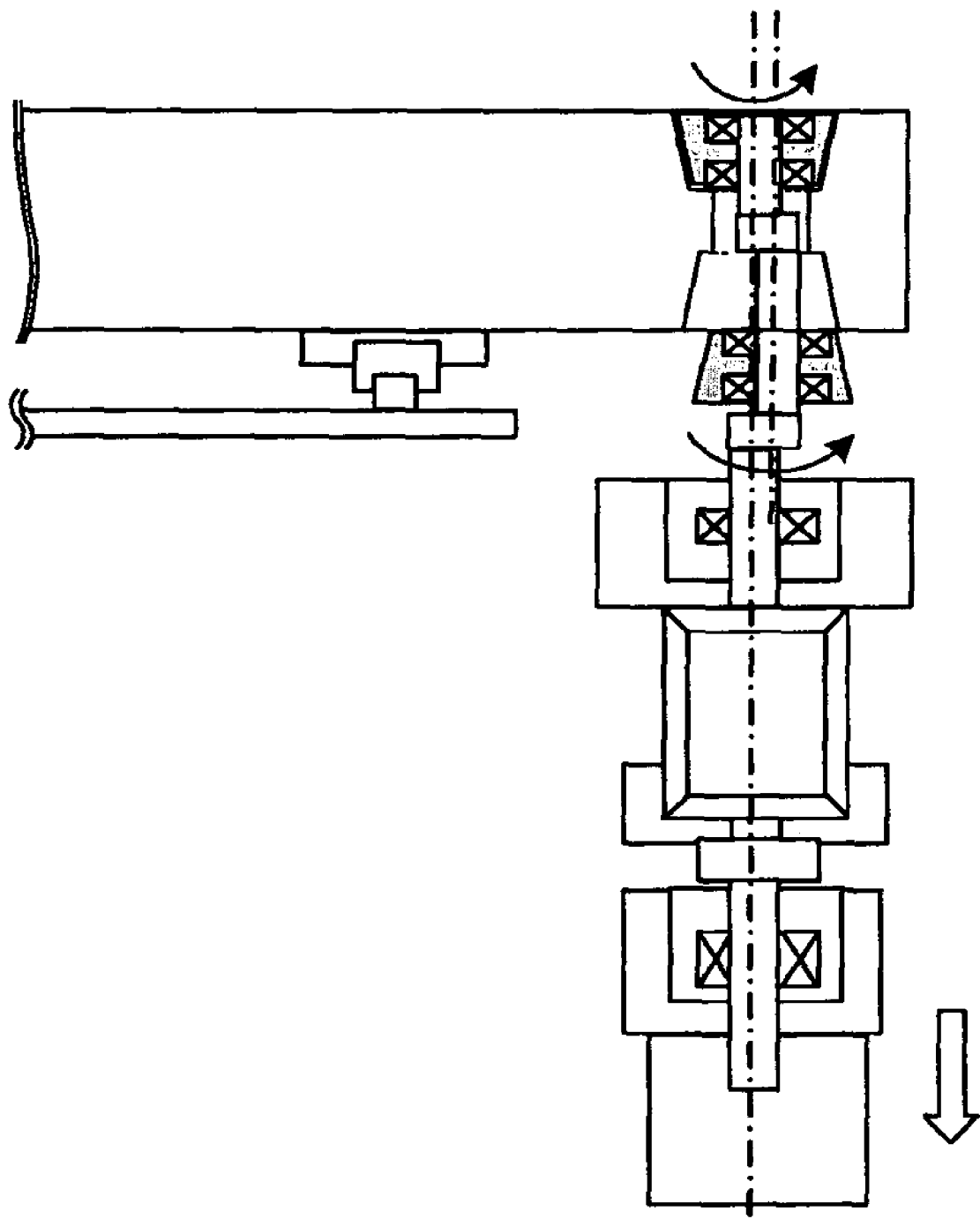

After the thermal processing (RTP) is completed, the elevating unit 101 is moved down as shown in FIG. 12. Accordingly, the centering cam 106 is inserted in the centering hole 306 whereas the oscillation cam 105 is separated downward from the oscillation hole 305. In this state, since the eccentric shaft 103b cannot influence the horizontal oscillation of the oscillation plate 140, the substrate finishes the oscillating operation and returns to the state of FIG. 9. In other words, as the centering cam 106 is inserted in the centering hole 306, the oscillation plate 140 that was deviated from the central axis R1 of the motor is corresponded to the central axis R1 again.

At this time, the rotation motor 510 is not rotated because the RTP is completed. Since both the centering cam 106 and the centering hole 306 have the inverse truncated cone shape, the centering cam 106 can be restricted from excessively moving downward by a lower part of the centering hole 306.

Figure 13:
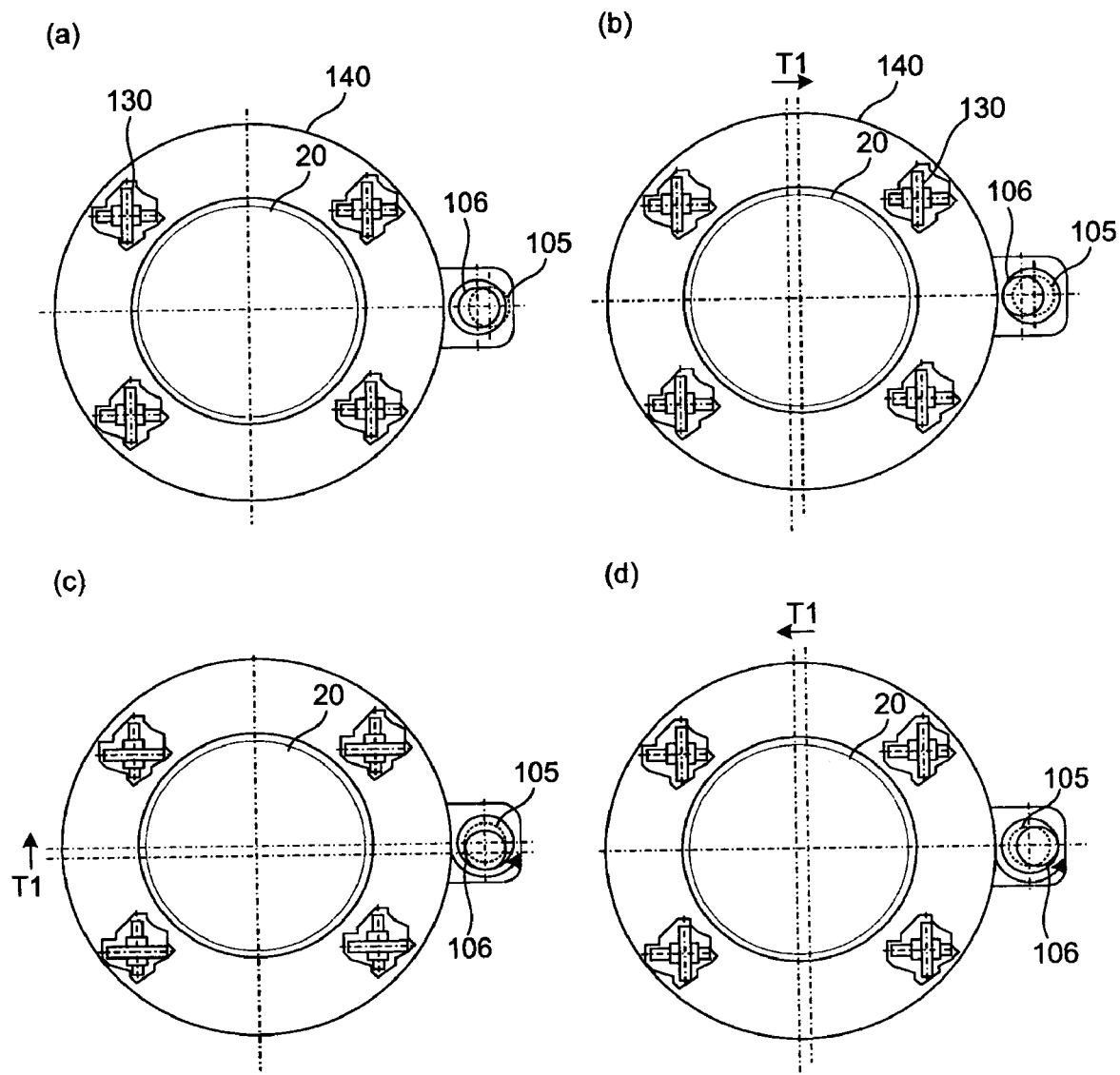
FIG. 13 and FIG. 14 are views illustrating a moving trace of an oscillation plate 140 shown in FIG. 4.
Figure 14:
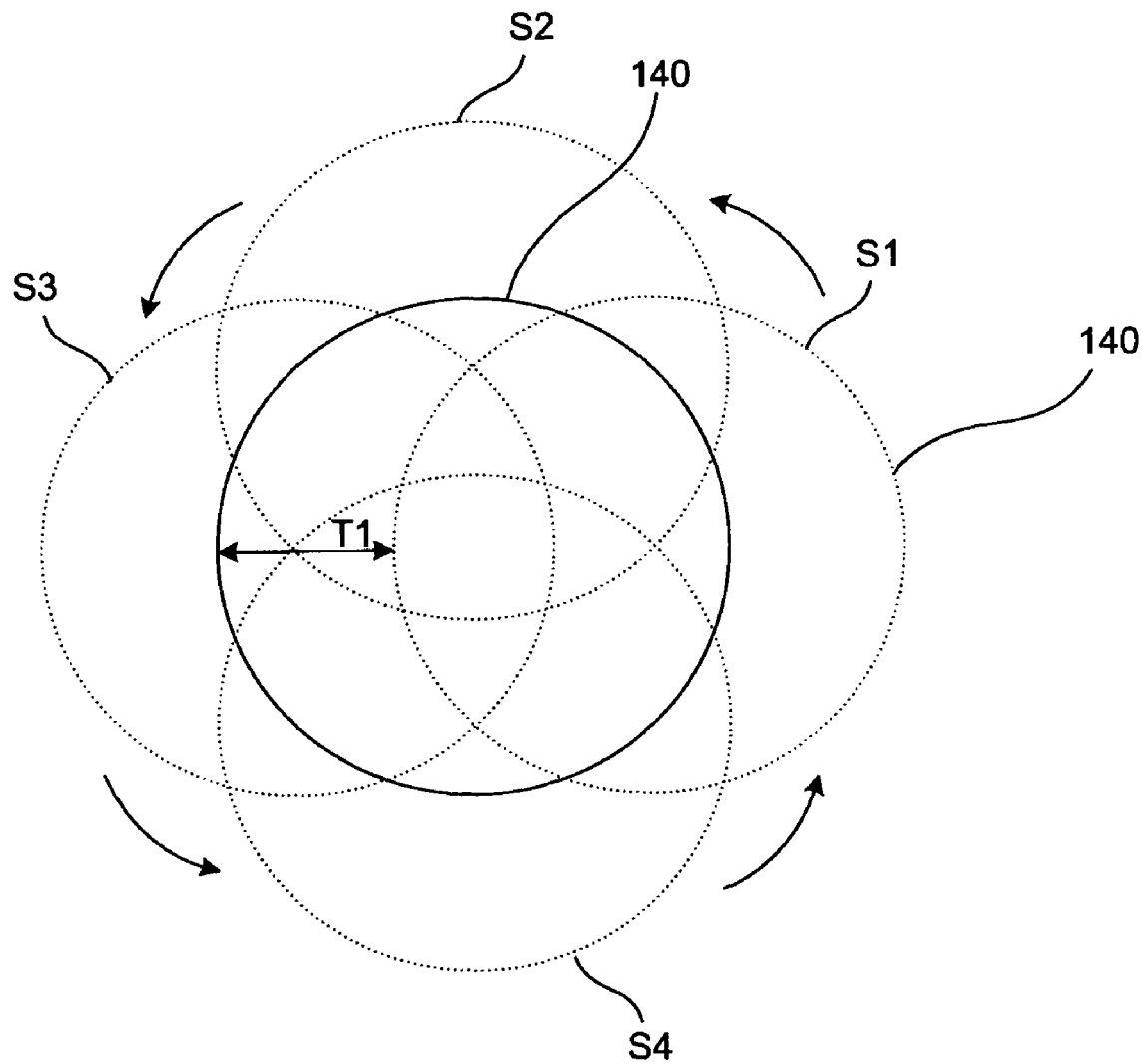

FIG. 13 shows the oscillation plate 140 as seen from the above, to explain the horizontal oscillation processes of the oscillation plate 140 according to rotation of the oscillation motor 102. FIG. 14 is a view showing a moving trace of the oscillation plate 140.

FIG. 13a corresponds to FIG. 9, and FIG. 13b corresponds to FIG. 10 and a state S1 of FIG. 14. FIG. 13d corresponds to FIG. 11 and a state S3 of FIG. 14, and FIG. 13c corresponds to a state S2 of FIG. 14, that is, between the states of FIG. 10 and FIG. 11. Accordingly, while the oscillation motor 102 rotates once counterclockwise, the oscillation plate 140 is oscillated sequentially along traces S1, S2, S3 and S4.

The oscillation radius T1 of the oscillation plate 140 may be greater than intervals between the respective annular heat overlapping sections 15a shown in FIG. 2a, so as to effectively cover thermal voids among the heat overlapping sections 15a as shown in FIG. 2b.

Rotation of the oscillation motor 102 influences only the horizontal oscillation of the substrate not the horizontal rotation of the substrate. During the oscillation, the bearing 105a mounted between the oscillation cam 106 and the eccentric shaft 103b helps smooth sliding between the oscillation cam 106 and the oscillation plate 140.

Figure 15:
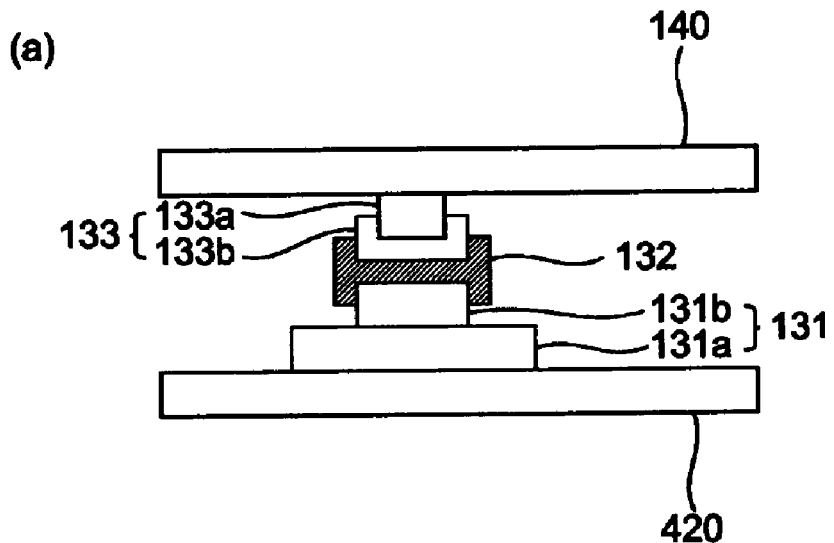
FIG. 15 is a view illustrating a 4-direction horizontal free linear motion (LM) block 130 shown in FIG. 4.
Figure 15:
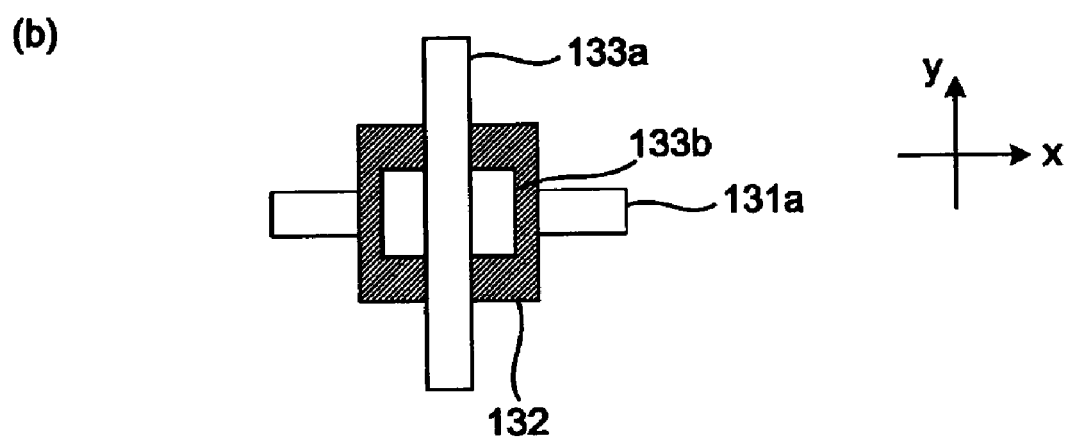
Figure 15:
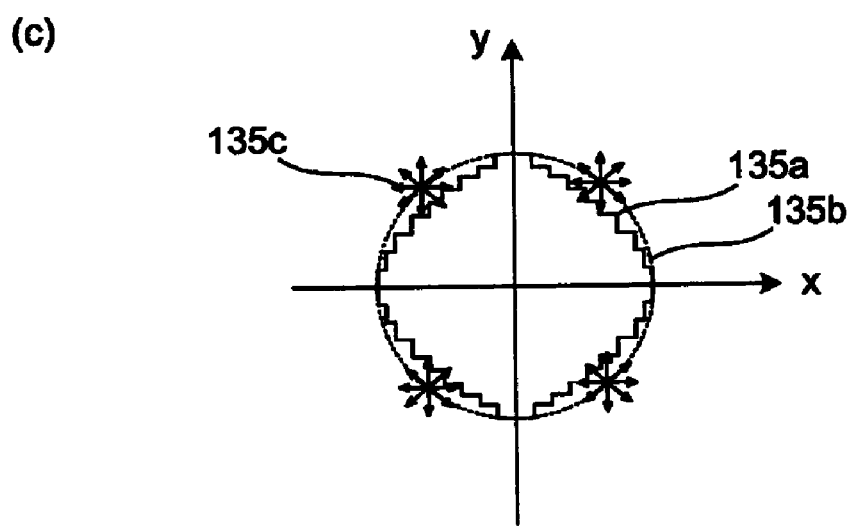

FIG. 15 is a view explaining a 4-direction horizontal free LM block 130. More particularly, FIG. 15a is a sectional view, FIG. 15b is a plan view, and FIG. 15c is a view for explaining the moving trace of the 4-direction horizontal free LM block 130.

The 4-direction horizontal free LM block 130 comprises a pair of LM guides 131 and 133 accumulatively mounted with a connector 132 interposed therebetween, to move perpendicularly to each other.

The lower LM guide 131 is structured in a manner that a lower LM block 131b is placed on an upper part of a lower LM rail 131a. The upper LM guide 133 is structured in a manner that an upper LM block 133b is placed on a lower part of an upper LM rail 133a. The connector 132 is mounted between the lower LM block 131b of the lower LM guide and the upper LM block 133b of the upper LM guide 133 to fixedly connect the LM blocks 131b and 133b to each other, such that the LM blocks 131b and 133b can be moved together. Therefore, when the lower LM block 131b of the lower LM guide 131 is horizontally moved in an X-axis direction and the upper LM rail 133a of the upper LM guide 133 is horizontally moved in a Y-axis direction, a 2D horizontal movement is generated in the X-axis and Y-axis directions.

When the oscillation plate 140 is horizontally moved by the 4-direction horizontal free LM block 130 along a trace 135a, the oscillation plate 140 substantially performs a circular movement along an imaginary circular trace 135b. Accordingly, the oscillation plate 140 horizontally oscillates while moving along the imaginary circular trace 135b, as indicated by arrows 135c in FIG. 15c. Thus, the oscillation plate 140 is oscillated and rotated simultaneously and, as a consequence, the RTP can be more uniformly performed.

EMBODIMENT 2

Horizontal Rotation and Horizontal Oscillation Using Maglev Motor

Figure 16:
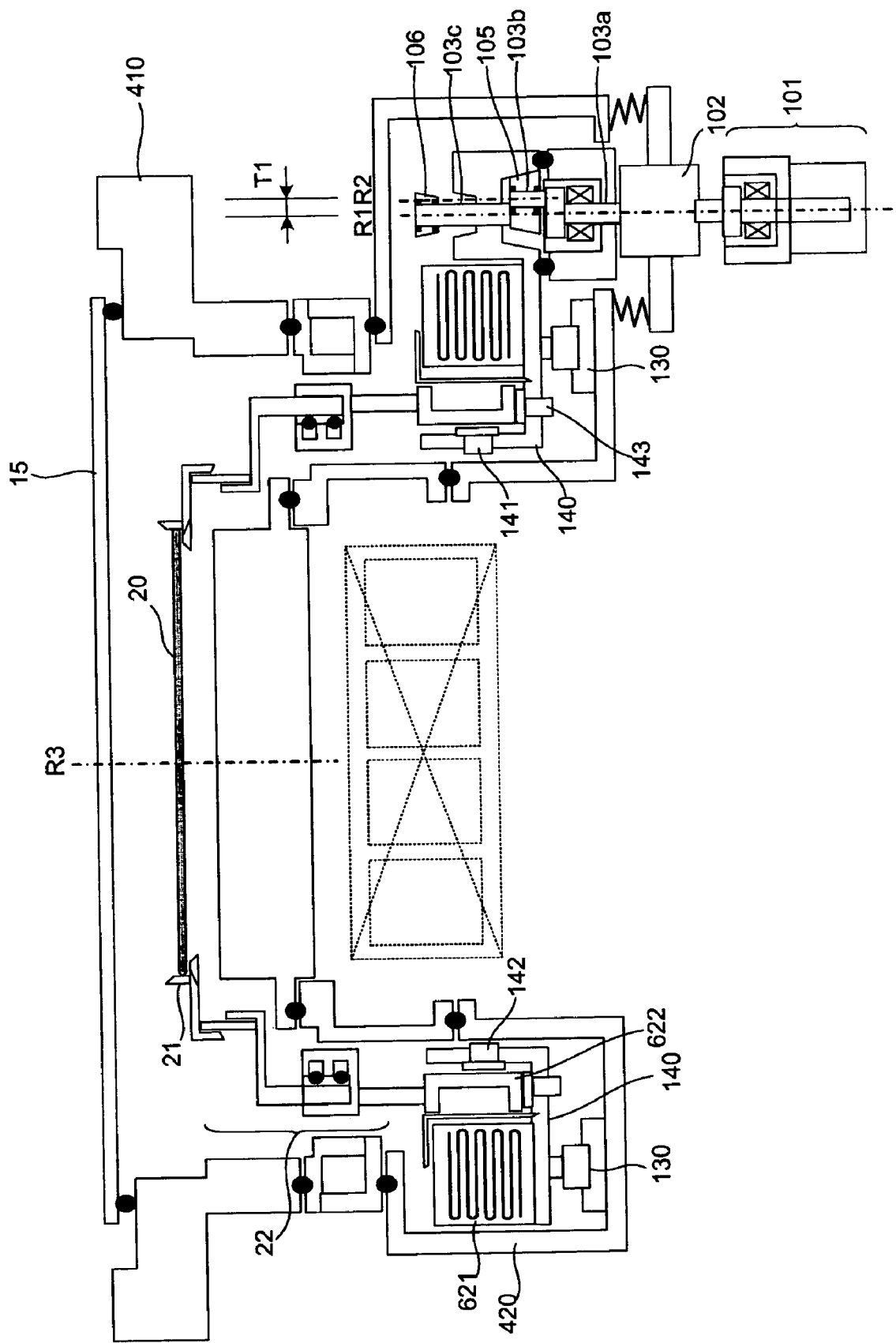
FIG. 16 is a view illustrating the structure of a substrate rotating and oscillating apparatus for an RTP according to a second embodiment of the present invention.

FIG. 16 is a view illustrating the structure of a substrate rotating and oscillating apparatus for an RTP according to a second embodiment of the present invention.

The maglev motor is rotated entirely by a magnetic force without requiring the rotation motor 510 as in FIG. 4. The maglev motor is configured in a manner that a rotor 622 of a magnet is mounted in a vacant center space of a stator 621 of an annular form. Since a coil is wound on the stator 621, the rotor 622 rotates in a horizontal position as floated by the magnetic field force generated from the coil. The principle of such a maglev motor is generally known in the art. Here, the rotor 622 is connected to the substrate supporter 21 through the connection member 22.

The maglev motor is wholly supported by the annular oscillation plate 140, and the oscillation plate 140 is oscillated by the oscillating structure the same as explained in the previous embodiment. The oscillation plate 140 is equipped with an X-axis displacement sensor 141, a Y-axis displacement sensor 142, and a Z-axis displacement sensor 143. A lower part of the chamber 410 is sealed by the housing 420. The maglev motor is mounted within the housing 420. In this embodiment, the rotation motor 510 used in the previous embodiment is dispensable, and both the rotor 622 and the stator 621 constituting the substrate rotating unit are disposed in the housing 420.

By applying the multipole-magnetized magnet or the maglev motor to the substrate rotating unit as described above, generation of vibration, noise and particles can be effectively restrained, accordingly improving the reliability of the manufacturing process. Also, the substrate oscillating apparatus disclosed in the embodiments of the present invention may also be applied when rotating the substrate using other general means such as a general motor, step motor and an air motor.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A substrate rotating and oscillating apparatus for a rapid thermal process (RTP), comprising a substrate rotating unit connected to a substrate supporter which supports a substrate so as to rotate the substrate by rotating the substrate supporter; an oscillation plate that supports the substrate rotating unit; and a substrate oscillating unit that oscillates the substrate by horizontally oscillating the oscillation plate,
wherein the substrate rotating unit comprises:
an oscillation motor of which rotational shafts comprise a lower center rotational shaft, an eccentric shaft, and an upper center rotational shaft, the lower and the upper center rotational shafts mounted on a central axis of the motor and the eccentric shaft mounted between the lower and the upper center rotational shafts to be deviated from the central axis;
an elevating unit moving the oscillation motor up and down;
an oscillation cam mounted to the eccentric cam; and
the oscillation plate having an oscillation hole for inserting the oscillation cam therein.

2. The substrate oscillating apparatus according to claim 1, wherein the substrate rotating unit comprises:
a rotation motor;
a lower multipole-magnetized magnetic wheel connected to a rotational shaft of the rotation motor and mounted with a magnet on an upper surface thereof;
an upper multipole-magnetized magnetic wheel disposed above the lower multipole-magnetized magnetic wheel and rotated along with the lower multipole-magnetized magnetic wheel by a magnetic force of the lower multipole-magnetized magnetic wheel;
a multipole-magnetized magnetic drum having a disc formed, being connected to a rotational shaft of the upper multipole-magnetized magnetic wheel and mounted with magnets on a sidewall thereof; and
a multipole-magnetized magnetic ring connected to the substrate supporter, mounted adjacent to the multipole-magnetized magnetic drum by an outer surface thereof and equipped with magnets on the outer surface, so as to be rotated along with the multipole-magnetized magnetic drum by a magnetic force of the multipole-magnetized magnetic drum.

3. The substrate oscillating apparatus according to claim 2, wherein the oscillation plate has an annular shape including an upward bent portion formed by bending an inner rim thereof upward, and a bearing is mounted between an inner surface of the multipole-magnetized magnetic ring and the upward bent portion.

4. The substrate oscillating apparatus according to claim 2, wherein the rotation motor is disposed at the outside of an RTP chamber, and a bellows is mounted to seal a gap between the rotation motor and the RTP chamber.

5. The substrate oscillating apparatus according to claim 1, wherein the substrate rotating unit comprises:
a stator having an annular form wound by a coil; and
a rotor mounted inside the stator and rotated by a magnetic field force generated from the coil, being in connection with the substrate supporter.

6. The substrate oscillating apparatus according to claim 5, wherein the stator and the rotor are both disposed within the RTP chamber.

7. The substrate oscillating apparatus according to claim 1, wherein the oscillation plate is equipped with X-axis, Y-axis, and Z-axis displacement sensors.

8. The substrate oscillating apparatus according to claim 1, wherein the elevating unit and the oscillation motor are mounted at the outside of the RTP chamber, whereas the oscillation cam is mounted in the RTP chamber.

9. The substrate oscillating apparatus according to claim 8, wherein a gap between the oscillation motor and the RTP chamber is sealed by a bellows.

10. The substrate oscillating apparatus according to claim 1, wherein a bearing is mounted between the oscillation cam and the eccentric shaft such that the oscillation cam is able to rotate independently from the eccentric shaft.

11. The substrate oscillating apparatus according to claim 1, wherein the oscillation cam has a truncated cone shape narrowing upward, and the oscillation hole also has the truncated cone shape so as to correspondingly insert the oscillation cam.

12. The substrate oscillating apparatus according to claim 1, wherein the upper center rotational shaft is mounted with a centering cam, and the oscillation plate is formed with a centering hole extended upward from the oscillation hole to insert the centering cam therein.

13. The substrate oscillating apparatus according to claim 12, wherein the centering cam has an inverse truncated cone shape which is narrowing downward, and the centering hole also has the inverse truncated cone shape to correspondingly insert the centering cam therein.

14. The substrate oscillating apparatus according to claim 12, wherein a bearing is mounted between the centering cam and the upper center rotational shaft such that the centering cap can be rotated independently from the upper center rotational shaft.

15. The substrate oscillating apparatus according to claim 12, wherein the oscillation cam and the centering cam are configured such that the centering cam is separated upward from the centering hole when the oscillation cam is moved up and inserted in the oscillation hole, and such that the oscillation cam is separated downward from the oscillation hole when the centering cam is moved down and inserted in the centering hole.

16. The substrate oscillating apparatus according to claim 1, wherein the oscillation plate is horizontally oscillated as placed on and guided by a horizontal free linear motion (LM) block.

17. The substrate oscillating apparatus according to claim 16, wherein the horizontal free LM block comprises:

a lower LM guide constituted by a lower LM block placed on an upper surface of a lower LM rail;

an upper LM guide, being constituted by an upper LM block placed on a lower surface of an upper LM rail, guiding a linear motion of the oscillation plate in a perpendicular direction to the motion of the lower LM guide; and a connector connecting the lower LM block of the lower LM guide with the upper LM block of the upper LM guide such that the lower LM block and the upper LM block are moved together.

* * * * *